United States Patent [19]

Fischer

[11] 4,286,236
[45] Aug. 25, 1981

[54] RF POWER AMPLIFIER WITH A MODULATING FACILITY

[75] Inventor: Axel Fischer, Bürstadt, Fed. Rep. of Germany

[73] Assignee: International Standard Electric Corp., New York, N.Y.

[21] Appl. No.: 63,218

[22] Filed: Aug. 2, 1979

[30] Foreign Application Priority Data

Aug. 16, 1978 [DE] Fed. Rep. of Germany ....... 2835751

[51] Int. Cl.³ ............................................... H03K 7/00
[52] U.S. Cl. .................................... 332/10; 332/31 T; 332/9 R
[58] Field of Search ................... 332/9 R, 11 R, 31 T, 332/10, 14, 17, 31 R, 45; 375/62–65

[56] References Cited

U.S. PATENT DOCUMENTS 3,810,020  5/1974  Fortuna et al. ....................... 332/9 R
4,179,672  12/1979  Voles ................................. 332/16 R Primary Examiner—David K. Moore
Attorney, Agent, or Firm—John T. O'Halloran; Alfred C. Hill

[57] ABSTRACT

An RF power amplifier with a pulse modulating facility is disclosed in which a pre-emphasized pulse modulating signal is derived from a plurality of amplitude values stored in a memory. The stored values are continuously changed by a control signal to give the output signal of the amplifier the desired shape. This compensates for nonlinearities and aging effects. The time required for the modulated carrier wave to pass through the amplifier need not be considered, because the envelope comparison between the amplifier output signal and the required modulating signal, which generates the control signal, is independent of the time of occurrence of the amplifier output signal.

7 Claims, 4 Drawing Figures

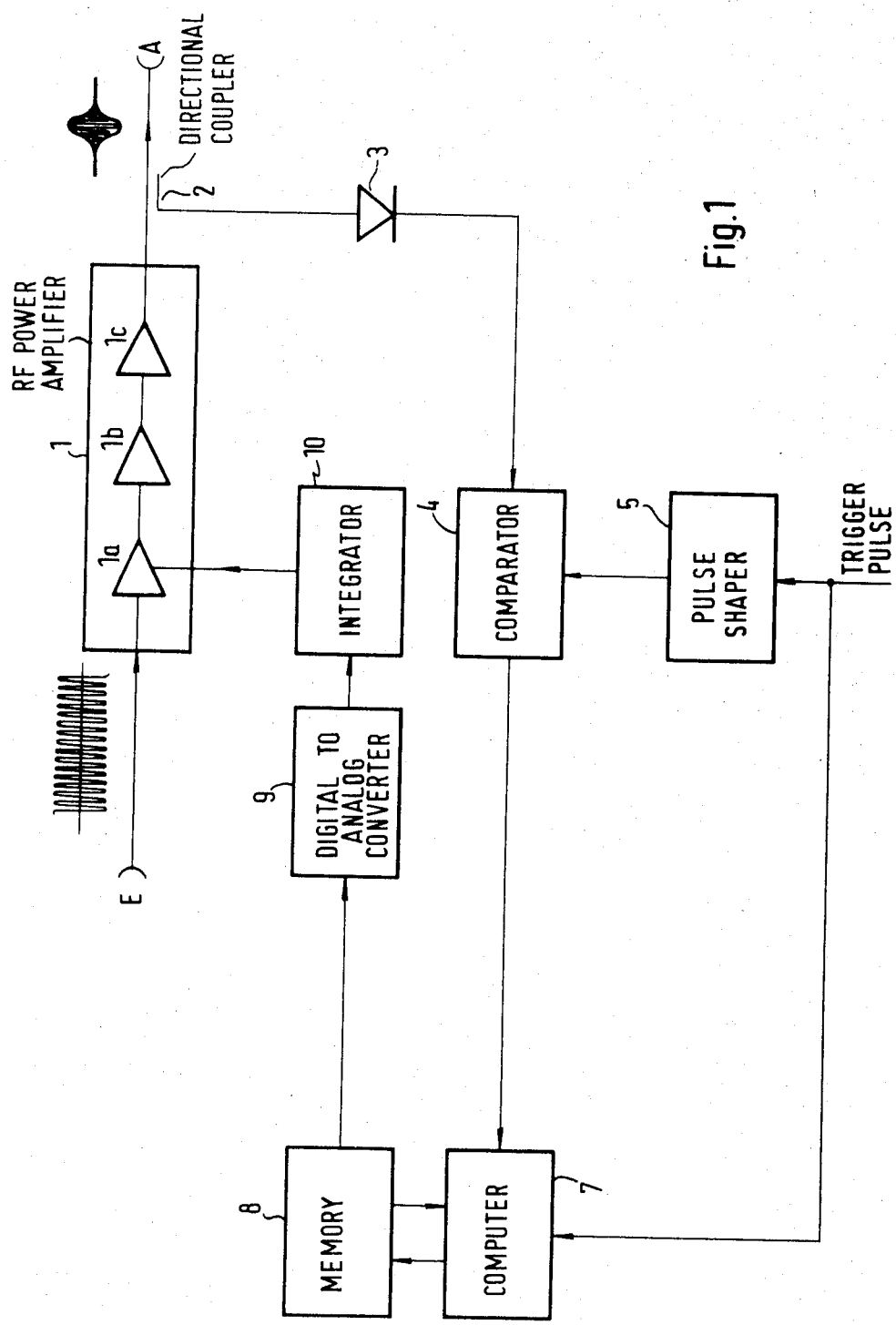

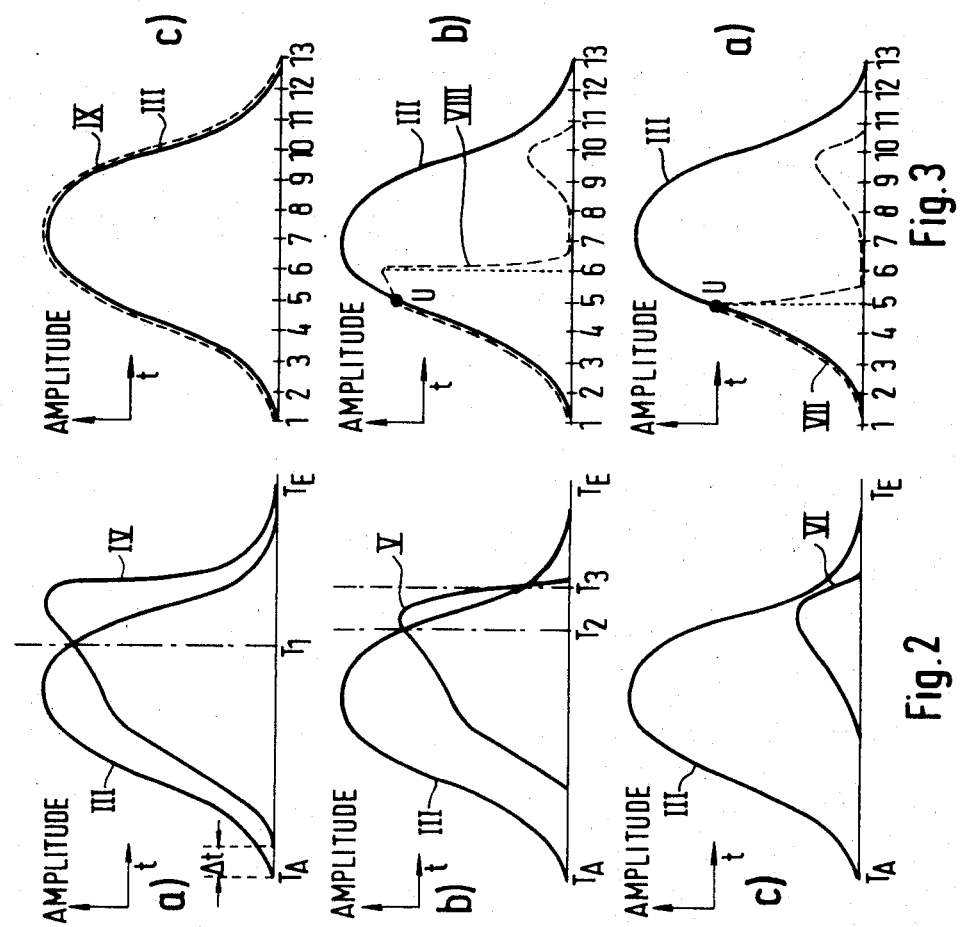

RF POWER AMPLIFIER WITH A MODULATING FACILITY

BACKGROUND OF THE INVENTION

The present invention relates to an RF (radio frequency) power amplifier and more particularly to an RF power amplifier with a modulating facility wherein the modulating signal is pre-emphasized so that the amplifier output signal has the desired shape.

An RF power amplifier of this kind is known from an article by S. Bayer, "R-F Power Amplifier System Solves Linearity Problems", Microwave Systems News, May-June 1971.

That article refers to amplitude modulation in general. No reference is made to modulation of the RF carrier wave by pulses, which is also an amplitude modulation of the RF carrier wave. The teaching contained in that article for controlling the modulating signal as a function of the amplifier output signal is not readily applicable to RF power amplifiers in which the RF carrier wave is modulated by pulses. This is true particularly if the pulses have only a short width (e.g. 8 $\mu$s (microseconds)). The time required with the known method of control is too long for such applications.

SUMMARY OF THE INVENTION

An object of the present invention is to provide an RF power amplifier having a modulating facility wherein the output pulse signals have exactly the deisred shape.

A feature of the present invention is the provision of an RF power amplifier capable of being modulated by a pulse modulating signal having an arrangement to pre-emphasize the modulating signal so that an RF modulated output signal of the amplifier has a desired shape, the arrangement comprising: first means coupled to the amplifier to provide the modulating signal including a memory storing therein a predetermined plurality of amplitude values from which the modulating signal is derived; the second means coupled to the first means and the output of the amplifier to rectify a portion of the amplifier output signal and to compare the rectified output signal with a reference pulse modulating signal to produce a control signal for the first means, the control signal having at least a first value when the rectified output signal is greater than the reference modulating signal and a second value when the rectified output signal is less than the reference modulating signal, the first and second values altering the stored amplitude values to provide a desired pre-emphasis for the modulating signal.

The desired pulse shape is obtained at the amplifier output even in case of nonlinear amplification and with multistage amplifiers. Effects of component aging are compensated. The time required for the carrier wave modulated by a pulse to travel through the series of amplifier stages and through the remaining facility need not be considered, since the comparison of the envelope of the RF signal to that of the reference modulating signal is independent of the time that the RF signal appears at the amplifier output.

The output pulse has the desired shape even at peak pulse powers above 1 kW (kilowatt). Since the RF carrier wave can be modulated with the modulating pulse signal in one of the amplifier's prestages, only little modulation power is required.

BRIEF DESCRIPTION OF THE DRAWING

Above-mentioned and other features and objects of this invention will become more apparent by reference to the following description taken in conjunction with the accompanying drawing, in which:

FIG. 1 is a block diagram of an RF power amplifier with a modulating facility in accordance with the principles of the present invention; and FIGS. 2 to 4 show graphs explaining the operation of the RF power amplifier of FIG. 1.

DESCRIPTION OF THE PREFERRED EMBODIMENT

The RF wave to be amplified and modulated is fed to an RF power amplifier 1, which is known per se and consists of three stages 1a, 1b, 1c, via an input E. The output signal is taken from an output A. In the first amplifier stage 1a, modulation by a pulse signal takes place.

To insure that the pulses at the output of amplifier 1 have the desired shape, the modulating signal is suitably pre-emphasized. This will now be explained in more detail.

For purposes of this example, the pulse will be assumed to be a DME pulse. By 32 amplitude values, for example, the amplitude curve of this pulse (its width is 3.5 $\mu$s) can be defined with sufficient accuracy. These amplitude values, which correspond to 32 samples taken from the DME pulse at regular intervals and whose envelope is the modulating signal, are stored in a memory 8 connected to a computer 7.

To generate the actual modulating signal, the values stored in memory 8, preferably in digital form, are converted into analog values in a digital-to-analog converter 9, and these analog values are fed to an integrator 10. The output signal of integrator 10 is the actual modulating signal with which the radio-frequency carrier wave is modulated in amplifier stage 1a.

The instant at which the carrier wave is modulated with the modulating pulse signal is determined by a trigger pulse. The trigger pulse is applied to computer 7, via which it determines the time at which memory 8 delivers the stored values to digital-to-analog converter 9.

So far, the modulating signal has not been pre-emphasized yet, so that the output pulse of amplifier 1 does not have the desired shape, e.g. due to amplifier nonlinearities.

Additional devices are therefore required which are described in the following.

Part of the amplifier output signal is coupled out by means of a directional coupler 2 and rectified in a rectifier 3. The rectitfied signal (this is the envelope of the RF pulse) is compared with the reference modulating signal in a comparator 4. The comparator may be the component Ser. No. 54,810 of Texas Instruments. The reference modulating signal is the signal with which the RF carrier wave would have to be modulated in order to obtain the desired signal at the amplifier output if no distortion occurs during modulation and amplification. In the steady state, the reference modulating signal and the rectified amplifier output signal have the same amplitude characteristic. The reference modulating signal is generated in a pulse shaper 5 (e.g. a circuit in which the amplitude value is stored in digital form and from which this value can be called via a digital-to-analog converter and an integrator) controlled by a trigger pulse. As stated earlier, the trigger pulse is also fed to computer 7, where it controls the time of delivery of the stored data.

The comparator 4 produces a binary "0" or a binary "1" depending on whether the rectified amplifier output signal is smaller or greater than the reference modulating signal. It will be assumed that a "0" is produced to indicate "greater". These binary signals are fed to computer 7, which, in response to these binary values and according to a suitable program, changes the values stored in memory 8 so that the actual modulating signal derived therefrom is pre-emphasized as desired.

The components used in the embodiment and not explained here as well as their operation are familiar to persons skilled in the art and are described in detail in the literature. For instance, the structure and operation of digital-to-analog converter 9 and the structure and operation of computer 7 can be found in the books "Notes on Analog-Digital Conversion Techniques" by Alfred K. Susskind, The M.I.T. Press, Cambridge, 1963, and "Arithmetic Operations in Digital Computers" by R. K. Richards, D. Van Nostrand Company Inc., Princeton, New Jersey, 1960, respectively.

The determination of the correct pre-emphasis will now be explained in more detail with the aid of FIGS. 2 to 4.

It will be assumed that when the set is turned on, memory 8 contains 32 values I (FIG. 4a; with 32 values and a pulse width of 3.5 μs, good results are obtained) whose envelope has the same shape as that of the reference modulating signal (the memory may also contain other arbitrary values; furthermore, at the beginning all values may be zero). The rectified amplifier output signal, however, does not have the desired shape III (FIG. 2a) but the shape designated IV (FIG. 2a). It is distorted and is shifted with respect to III by Δt due to the propagation delay.

Since the rectified amplifier output signal is smaller than the reference modulating signal during the time between TA and T1, comparator 4 produces a binary "0" during this time. Between T1 and TE, a binary "1" is applied to computer 7.

Under the control of computer 7, all values stored in memory 8 are decremented step by step until comparator 4 stops producing a binary "0", it being quite possible that some of the stored values become zero. FIG. 2b shows an intermediate state. The rectified amplifier output signal has a shape designated V. Since between the times T2 and T3 the curve V is still above the curve III, the stored values are further reduced. Only the curve VI of FIG. 2c lies completely below the curve III. Memory 8 now contains the values designated I' indicated by broken lines in FIG. 4a. For simplicity, FIG. 4 does not show all 32 values but only a few of them. The modulating signal has the shape designated I'$_E$. If the RF carrier wave is modulated with the signal derived from these stored values, the amplifier output signal has the shape VI of FIG. 2c.

The required distortion is obtained particularly advantageously in the following manner. After each comparison in comparator 4, the first stored amplitude value is incremented by a given value until the rectified amplifier output signal exceeds the reference modulating signal for the first time.

In FIG. 3a, it is assumed that the originally stored amplitude values have been corrected up to the fifth value, so that the rectified amplifier output signal VII has the desired shape up to the point U (FIG. 3a). In FIG. 3b, it is assumed that the correct value of the sixth stored amplitude value is just being determined; it has not been quite reached yet, however. The rectified amplifier output signal has the shape VIII. Only in FIG. 3c does the amplifier output signal have the desired shape IX, which coincides with the shape III of the reference modulating signal.

The values II now stored in memory 8, their envelope II$_E$, and the qualitative relationship to their originally stored values are illustrated in FIGS. 4a and 4b. If derived from these values, the actual modulating signal will have the required pre-emphasis. It is thus insured that the modulated amplifier output signal has the correct shape at the correct time. Propagation times are eliminated.

If variations occur during operation, these will be compensated continuously. The same is true for aging effects. In contrast to the time after turn-on, no long control times are required during operation.

As mentioned above, the stored amplitude values were chosen so that the curves VII, VIII, IX lie just above the cure III. If all these amplitude values are decreased again by one step, these curves will lie just below the curve III. In both cases, the curve III is matched very closely.

While I have described above the principles of my invention in connection with specific apparatus it is to be clearly understood that this description is made only by way of example and not as a limitation to the scope of my invention as set forth in the objects thereof and in the accompanying claims.

I claim:

1. An RF power amplifier capable of being modulated by a pulse modulating signal having an arrangement to pre-emphasize said modulating signal so that an RF modulated output signal of said amplifier has a desired shape, said arrangement comprising:

first means coupled to said amplifier to provide said modulating signal for amplitude modulating an RF carrier coupled to an input of said amplifier, said first means including a memory storing therein a predetermined plurality of amplitude values from which said modulating signal is derived;

second means coupled to the output of said amplifier to rectify a portion of said amplifier output signal; and third means coupled to said second means and said memory to compare said rectified output signal with a reference pulse modulating signal to produce a control signal for said memory, said control signal having at least a first value when said rectified output signal is greater than said reference modulating signal and a second value when said rectified output signal is less than said reference modulating signal, said first and second values altering said stored amplitude values to provide a desired pre-emphasis for said modulating signal.

2. An arrangement according to claim 1, wherein said control signal has a third value when said rectified output signal equals said reference modulating signal.

3. An arrangement according to claims 1 or 2, wherein said stored values are digital values, and said first and second values are each a different binary state.

4. An arrangement according to claim 3, wherein said first value is a binary "1" state, and said second value is a binary "0" state.

5. An arrangement according to claim 4, wherein said first means further includes
 a digital-to-analog converter coupled to the output of said memory, and
 an integrator coupled between said converter and said amplifier.

6. An arrangement according to claim 3, wherein said first means further includes
 a digital-to-analog converter coupled to the output of said memory, and
 an integrator coupled between said converter and said amplifier.

7. An arrangement according to claim 1, wherein said first means further includes
 a digital-to-analog converter coupled to the output of said memory, and
 an integrator coupled between said converter and said amplifier.

* * * * *